United States Patent [19]
Gopal

[11] Patent Number: 6,134,513
[45] Date of Patent: *Oct. 17, 2000

[54] METHOD AND APPARATUS FOR SIMULATING LARGE, HIERARCHICAL MICROELECTRONIC RESISTOR CIRCUITS

[75] Inventor: Nanda Gopal, Santa Clara, Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/956,868

[22] Filed: Oct. 23, 1997

[51] Int. Cl.$^7$ ........................... G06F 17/50
[52] U.S. Cl. .................. 703/14; 703/17; 703/18
[58] Field of Search ............ 395/500.35, 500.36, 395/500.37, 500.38, 500.39, 500.4, 500.41

[56] References Cited

U.S. PATENT DOCUMENTS

| | | | |
|---|---|---|---|
| 5,050,091 | 9/1991 | Rubin | 395/500.02 |
| 5,247,468 | 9/1993 | Henrichs et al. | 395/500.35 |
| 5,301,318 | 4/1994 | Mittal | 395/500.12 |
| 5,313,398 | 5/1994 | Rohrer et al. | 395/500.23 |
| 5,394,346 | 2/1995 | Milsom | 395/500.35 |
| 5,548,524 | 8/1996 | Hernandez et al. | 395/500.13 |
| 5,805,860 | 9/1998 | Parham | 395/500.13 |
| 5,808,896 | 9/1998 | Weber | 395/500.13 |
| 5,847,966 | 12/1998 | Uchino et al. | 395/500.03 |
| 5,901,064 | 5/1999 | Weber et al. | 395/500.13 |

OTHER PUBLICATIONS

Karnik et al, ASIC Conf. and Exhibit, 1994, Proc. 7th Annual IEEE Int., Hierarchical mixed–level simulation of VHDL decriptions, pp. 170–173, Aug. 1994.

Grebene, Northcon/94, "A methodical approach for macro-modeling of analog circuits", pp. 205–210, Oct. 1994.

Yoon, Circuits and Systems, 1994, Proc. of 37th Midwest Symposium, "Electrical simulation and analysis of large complex electrical systems", vol. 1, pp. 697–700, Aug. 1994.

Schulz et al., European Test Conf., 1989, "Hierarchical fault simulation in combinational circuits", pp. 33–40, Apr. 1989.

Behrens et al., Computer–Aided Design, 1996, ICCAD–96, IEEE/ACM Int. Conf., "Hierarchical partitioning", pp. 470–477, Nov. 1996.

*Primary Examiner*—Kevin J. Teska
*Assistant Examiner*—Kyle J. Choi
*Attorney, Agent, or Firm*—Blakely, Sokoloff, Taylor & Zafman LLP

[57] ABSTRACT

A computer implemented method for simulating a resistive circuit, including a plurality of macro circuits that are arranged hierarchically. The method includes the steps of reading a netlist description of the resistive circuit and recursively traversing the resistive circuit starting from terminal nodes of a macro circuit at a highest level of hierarchy using precharacterizations of each of the plurality of macro circuits to determine node voltages and branch currents of the resistive circuit.

22 Claims, 18 Drawing Sheets

```
      ⎧ . MACRO M1
      ⎪ + DUM1  ⎫
      ⎪ + N1    ⎪
      ⎪ + N2    ⎬ PRIMARY    202
      ⎪ + DUM2  ⎪ TERMINALS
      ⎪ + N3    ⎪
200 ⎨ + N4    ⎭
      ⎪ R1 N1 N5 15
      ⎪ R2 N5 N3 53
      ⎪ R3 N5 0  50
      ⎪ R4 N2 N6 26
      ⎪ R5 N6 N4 64
      ⎩ . EOM
      ⎧ . MACRO M2
      ⎪ + NN1
      ⎪ + NN2
      ⎪ + NN3
      ⎪ + NN4
      ⎪ + NN5
      ⎪ R1 NN1 NN6 16
      ⎪ R2 NN2 NN7 27
      ⎪ R3 NN3 NN8 38
      ⎪ R4 NN4 NN9 0
      ⎪ R5 NN11 NN5 115
      ⎪ R6 NN10 0 100
      ⎪
      ⎪ @I1  M1
      ⎪ + NDUM1
      ⎪ + NN6
      ⎪ + NN7
204 ⎨ + NDUM2
      ⎪ + NN12
      ⎪ + NN10
      ⎪ @I2  M1
      ⎪ + NDUM3
      ⎪ + NN8
      ⎪ + NN9
      ⎪ + NDUM4
      ⎪ + NN11
      ⎪ + NN10
      ⎩ . EOM
      ⎧ V1  1  0  DC  1.0
208 ⎨ V3  3  0  DC  3.0
      ⎩ V4  4  0  DC  4.0
      ⎧ @TOP M2
      ⎪ + 1
      ⎪ + 2
210 ⎨ + 3
      ⎪ + 4
      ⎪ + 5
      ⎩ . END
```

FIG. 2

M1
NODE MAP
=========
    0: GND
    1: NDUM1
    2: N1
    3: N2
    4: NDUM2
    5: N3
    6: N4
    7: N5
    8: N6
      } 502

M2
NODE MAP
=========
    0: GND
    1: NN1
    2: NN2
    3: NN3
    4: NN4
    5: NN5
    6: NN6
    7: NN7
    8: NN8
    9: NN9
  10: NN11
  11: NN10
  12: NNDUM1
  13: NNDUM2
  14: NN12
  15: NN13
  16: NNDUM3
  17: NNDUM4
      } 504

TOP LEVEL
NODE MAP
=========
0: GND
1: 1
2: 2
3: 4
4: 2
5: 5
    } 506

M2
SHORTED NODE MAP
==================
0: -1
1: -1
2: -1
3: -1
4: -1
5: -1
6: -1
7: -1
8: -1
9: 4
10: -1
11: -1
12: -1
13: -1
14: -1
15: -1
16: -1
17: -1

*FIG. 7*

$ DC CURRENTS

| ELEMENT | CURRENT | RESISTANCE |
|---|---|---|
| $$ V1 | 1.2346E-02 | |
| $$ V3 | 2.9126E-02 | |
| $$ V4 | 2.1053E-02 | |

TOP M2

| R1 | 1.2346E-02 | 16 |
| R2 | 0.0000E+00 | 27 |
| R3 | 2.9123E-02 | 38 |
| R5 | 0.0000E+00 | 115 |
| R6 | 2.1053E-02 | 100 |

I1 M1

| R1 | 1.2346E-02 | 15 |
| R2 | 0.0000E+00 | 53 |
| R3 | 1.2346E-02 | 50 |
| R4 | 0.0000E+00 | 26 |
| R5 | 0.0000E+00 | 64 |

EOM I1
I2 M1

| R1 | 2.9126E-02 | 15 |
| R2 | 4.1895E-18 | 53 |
| R3 | 2.9126E-02 | 50 |
| R4 | 2.1053E-02 | 26 |
| R5 | 2.1053E-02 | 64 |

EOM I2
EOM TOP
.END

— 1300

| $ DC VOLTAGES | INDEX | NODE_NAME | VOLTAGE |
|---|---|---|---|
| | 0 | VSS | 0.0000E+00 |
| | 1 | 1 | 1.0000E+00 |
| | 2 | 3 | 3.0000E+00 |
| | 3 | 4 | 4.0000E+00 |
| | 4 | 2 | 0.0000E+00 |
| | 5 | 5 | 1.4563E+00 |
| #END | | | |
| #TOP M2 | | | |
| | 0 | VSS | 0.0000E+00 |
| | 1 | NN1 | 1.0000E+00 |
| | 2 | NN2 | 0.0000E+00 |
| | 3 | NN3 | 3.0000E+00 |
| | 4 | NN4 | 4.0000E+00 |
| | 5 | NN5 | 1.4563E+00 |
| | 6 | NN6 | 8.0247E-01 |
| | 7 | NN7 | 0.0000E+00 |
| | 8 | NN8 | 1.8932E+00 |
| | 9 | NN9 | 4.0000E+00 |
| | 10 | NN11 | 1.4563E+00 |
| | 11 | NN10 | 2.1053E+00 |
| | 12 | NNDUM1 | 0.0000E+00 |
| | 13 | NNDUM2 | 0.0000E+00 |
| | 14 | NN12 | 6.1728E-01 |
| | 15 | NN13 | 0.0000E+00 |
| | 16 | NNDUM3 | .0000E+00 |
| | 17 | NNDUM4 | 0.0000E+00 |
| #END TOP | | | |
| #I1 M1 | | | |
| | 0 | VSS | 0.0000E+00 |
| | 1 | NDUM1 | 0.0000E+00 |
| | 2 | N1 | 8.0247E-01 |
| | 3 | N2 | 0.0000E+00 |
| | 4 | NDUM2 | 0.0000E+00 |
| | 5 | N3 | 6.1728E-01 |
| | 6 | N4 | 0.0000E+00 |
| | 7 | N5 | 6.1782E-01 |
| | 8 | N6 | 0.0000E+00 |
| #EOM I1 | | | |
| #I2 M1 | | | |
| | 0 | VSS | 0.0000E+00 |
| | 1 | NDUM1 | 0.0000E+00 |
| | 2 | N1 | 1.8932E+00 |
| | 3 | N2 | 4.0000E+00 |
| | 4 | NDUM2 | 0.0000E+00 |
| | 5 | N3 | 1.4563E+00 |
| | 6 | N4 | 2.1053E+00 |
| | 7 | N5 | 1.4563E+00 |
| | 8 | N6 | 3.4526E+00 |
| #EOM I2 | | | |

METHOD AND APPARATUS FOR SIMULATING LARGE, HIERARCHICAL MICROELECTRONIC RESISTOR CIRCUITS

FIELD OF THE INVENTION

The present invention is in the field of circuit simulation. More particularly, the present invention is in the field of simulating very large, hierarchical resistive circuits.

BACKGROUND OF THE INVENTION

The performance of today's very large scale integrated circuits is improved by employing combinations of increased operating frequencies and increased circuit complexity as well as by decreasing on-chip feature dimensions and supply voltages. The consequential increase in the resistive nature of the power supply network, easily one of the most critical networks in the circuit, results in an increased susceptibility to serious problems such as electromigration, overheating, and drop in voltage levels in power rails toward the center of the integrated circuit ("voltage droop"). These problems have been well known in the industry to adversely effect the reliability and operation of the circuit. For these reasons, reliability verification prior to fabrication is recognized as an essential stage in the design process.

A consequence of increasing size and complexity in integrated circuits is that existing reliability verification tools are literally overwhelmed when presented with some of today's very large scale integrated circuits.

In the case of verifying power networks, reliability verification tools typically comprise computer programs for circuit simulation. These circuit simulation tools operate on a model of the power network as a description of hierarchical resistive circuits. Hierarchical resistive circuits are characterizations of a circuit as networks of resistances connected by nodes. As is known in the art, such networks are connected to voltage supplies, or source voltages, and in operation have particular currents flowing through each resistance and certain voltages at each node. The currents are known as branch currents, where a branch connects two nodes, and the voltages are known as node voltages. Hierarchical resistive networks are divided into levels of hierarchy, usually on the basis of particular functions of subcircuits. The subcircuits are known as macro circuits or macros. For example, a macro circuit with the function of a comparator would contain within it, at lower level(s) of hierarchy, the circuits representing the logic gates that make up the comparator. The circuit simulation tools simulate the behavior of the model circuit under actual source voltages with the object of obtaining branch currents and node voltages. Once branch currents and node voltages are obtained it is possible to determine power levels at various area in the circuit using well known equations. Thus, it can be determined if there will be overheating problems, voltage droop problems or electromigration problems. In this way, a circuit designer tries to obtain enough information to adjust the design of the circuit before the cost of fabrication is incurred.

Current simulation tools simulate the behavior of the resistive circuit only by removing all hierarchical information (flattening the circuit) and solving for node voltages and branch currents by constructing and solving a matrix according to well known circuit analysis techniques. As circuits become larger and more complex, however, the matrix becomes prohibitively large to store and solve. Very large matrices require not only large amounts of storage space but also long periods of time to solve. For example, a circuit with 1000 nodes (a modest number in comparison to the total number of nodes in a very large integrated circuit), the size of a full admittance matrix, such as is commonly used with current simulation tools, is one million numbers. It is currently possible, according to known techniques, to partition the flattened circuit into more manageable chunks. This partitioning, however, is very dependent on circuit topology and suffers from other disadvantages, such as loss of original hierarchical information, as further described below.

Loss of original hierarchical information is a serious disadvantage of present simulation tools. For instance, when existing simulation tools flatten the hierarchical resistive circuit, no hierarchical information is saved. For this reason, when voltage droop is discovered at a particular node or electromigration is discovered at a particular resistance, even though the resistance or node may be eventually identified, its original hierarchical name or identifier has been lost and can only be recovered through the development and use of software tools designed for the purpose. This is costly in terms of time and effort. Very large integrated circuits are commonly designed using teams of designers, each working on different parts of the integrated circuit. When problems that require re-design, such as voltage droop or electromigration, are discovered the designer or team of designers that owns the part of the overall integrated circuit must be identified. It may be difficult to identify the owners of the problematic part of the circuit when original hierarchical information is no longer available.

Another significant limitation of existing simulation tools is their inability to identify and handle floating nodes before simulation actually takes place. This is significant because when floating nodes exist in the circuit (that is, nodes which are not connected to a reference voltage via a direct current (DC) path) current simulators fail completely. In addition, such a failure may not be immediately traceable to the floating node or nodes. Floating nodes are a possible cause of, for example, anomalous results of timing simulation. Because floating nodes are such a problem, it is commonly necessary to write scripts to try to identify floating nodes before they cause testing to fail. Although floating nodes are undesirable because they can introduce capacitive effects that seriously affect integrated circuit performance, they are commonly introduced by accident in the design process.

Another disadvantage of existing simulation tools is their inability to efficiently and accurately handle short circuits in the resistive circuit. Typically, existing simulation tools identify shorts and handle them by inserting an extremely small resistance in the place of each short. This method of handling shorts has at least two problems. First, the resistance that is used in these methods does not accurately reflect the resistance in a short circuit. Short circuits have zero resistance and zero voltage. For instance, because voltages are arrived at by dividing current by resistance, a very large, but inaccurate, current will be assigned to short circuits. Second, because the typical method of obtaining node voltages and branch currents for resistive circuits is to solve a matrix, the extremely small resistance numbers will cause the matrix to be ill conditioned, thus introducing potentially significant numerical errors.

The present invention overcomes the problems described above by employing efficient recursive techniques that avoid the solution of large matrices, handle shorts and floating nodes effectively, and retain hierarchical information in a final solution of an entire resistive circuit.

SUMMARY OF THE INVENTION

A computer implemented method for simulating a resistive circuit, including a plurality of macro circuits that are arranged hierarchically is described. The method includes the steps of reading a netlist description of the resistive circuit and recursively traversing the resistive circuit starting from terminal nodes of a macro circuit at a highest level of hierarchy using precharacterizations of each of the plurality of macro circuits to determine node voltages and branch currents of the resistive circuit.

BRIEF DESCRIPTION OF THE DRAWINGS

FIG. 2 is an example of the syntax of an input file operated on according to an embodiment.

FIG. 5 is an example of a node map according to an embodiment.

FIG. 7 is an example of a shorted node map according to one embodiment.

FIG. 18 is another example of an output file according to one embodiment.

DETAILED DESCRIPTION

A circuit simulation method for evaluating the performance and reliability of a very large microelectronic circuit or system prior to its fabrication is described. The method includes the transformation, storage, and analysis in a computer of a representation of a hierarchical resistive network with independent voltage and current sources. Subcircuits, or macros, representing hierarchical blocks are transformed into macro models based on terminal parameters, which are temporarily stored on disk in a more compact manner than in conventional methods.

In one embodiment, an efficient recursive procedure is employed to compute node voltages and branch currents through every element (herein an element is a resistance) in the network, without actual instantiation of each macro along with its internal elements and nodes, as required in a conventional circuit simulation. A complete DC solution of an entire circuit is obtained by performing an ordered traversal of the circuit hierarchy and employing a series of local solutions computed at each level of hierarchy using the macro models.

The present invention provides the ability to handle the serious problems of floating nodes and short circuits. In the case of floating nodes, for example, floating nodes are identified in a preprocessing step and connected to a voltage source so that singularities that are typically fatal to the analysis process are avoided.

The resulting output contains all the voltages and currents in the network in association with all the hierarchical information of the original network.

Figure 1:
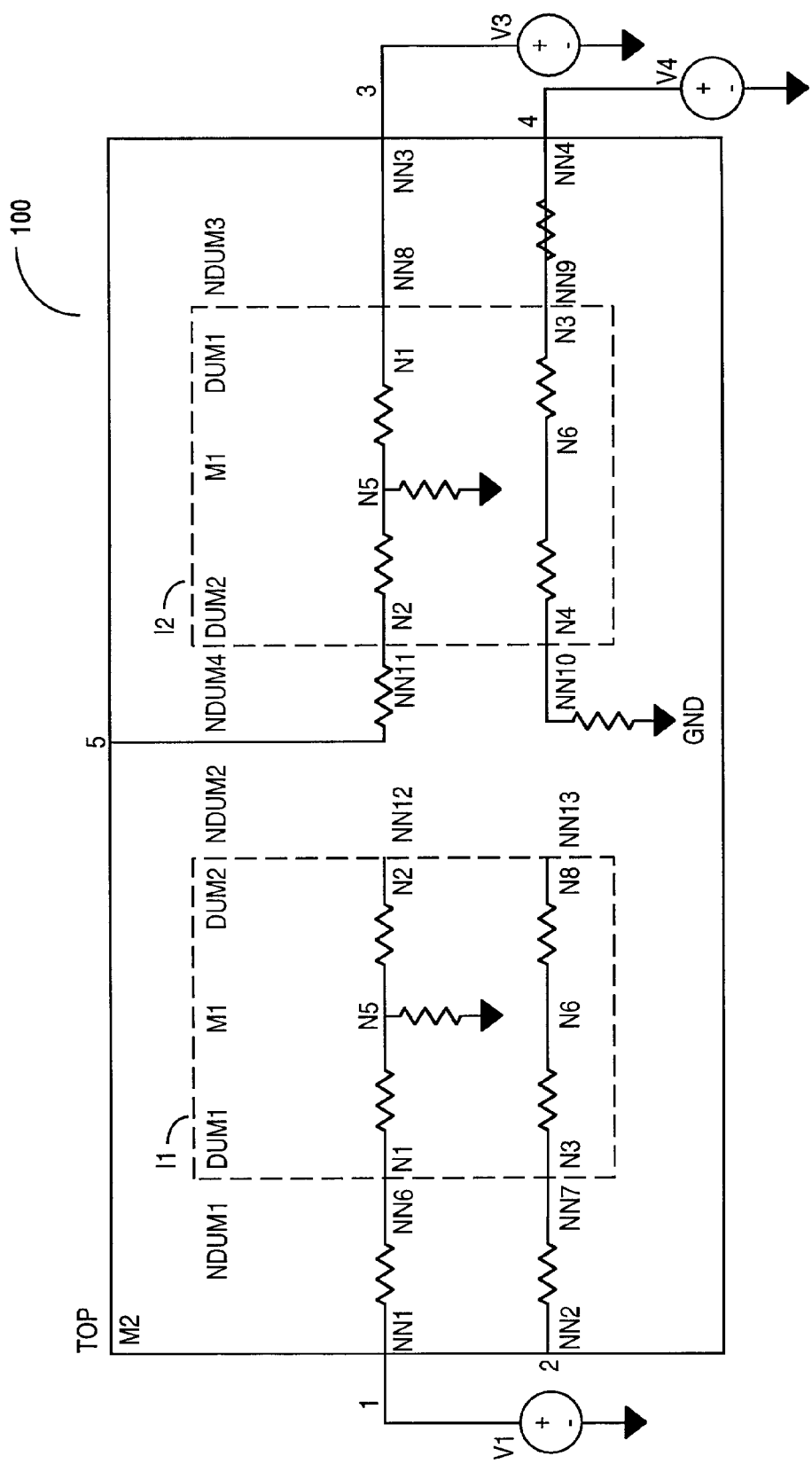
FIG. 1 is a circuit diagram of a resistive circuit according to one embodiment of the present invention.

FIG. 1 is a circuit diagram of a hierarchical resistive network analyzable using the simulation method of one embodiment of the present invention. Circuit 100 of FIG. 1 is an example that is useful for illustrative purposes, but actual resistive networks representing models of power networks in actual high performance very large microelectronic integrated circuits are much larger and include many more levels of hierarchy and many more resistors than are shown in FIG. 1.

Resistive circuit 100 includes two levels of hierarchy. A top level of hierarchy, labeled "top", includes one instance of macro M2. A macro is typically a subcircuit performing a particular function in the overall integrated circuit. A particular macro may be repeated many times on an integrated circuit. Each time a particular macro occurs it is an instance of the macro. For example, in resistive circuit 100 the occurrence of macro M2 is denoted "top". At the next level of hierarchy, that is, the level of hierarchy below top, occur two instances of macro M1. These are instances 1 and 2, labeled I1 and I2. Resistive circuit 100 has three independent voltage sources 1, 3, and 4, and one ground, GND. The primary terminals of instance top of macro M2 are terminals 1, 2, 3, 4 and 5. Terminals, or nodes, internal to instance top of macro M2 but not internal to instances of macro M1 have two node labels. These are symbolic node labels that both enumerate the node and convey hierarchical information. For example, node 1, which is primary terminal 1 in instance top of macro M2, is also node NN1 of macro M2. Similarly, primary node N1 of instance 1 of macro M1 is node NN6 of macro M2. All nodes of resistive circuit 100 are similarly labeled with hierarchical information. Resistive circuit 100 includes four nodes which are not connected to any voltage source. An example of such a node is node DUM1 of instance 1 of macro M1 which is also node NDUM1 of instance top of macro M2. Resistive circuit 100 also includes some circuit anomalies. These are a short circuit between nodes NN4 and NN9 of instance top of macro M2, and a floating node cluster between nodes NN2 and NN13 of instance top of macro M2. Resistive circuit 100 will be used as an example herein to illustrate embodiments of the present inventions.

FIG. 2 is a text description of a circuit to be analyzed according to one embodiment of the present invention The text description of FIG. 2 is a description of resistive circuit 100 and constitutes the input operated upon in one embodiment of the present invention. The present invention operates upon text descriptions, such as the description of FIG.

2, that are generated by commercially available network extractors. Description 200 is a description of macro M1. Description 200 shows primary terminals 202 labeled with their names as they appear with respect to macro M1. Description 200 also shows all the resistances present in macro 1, for example R1 is situated between nodes N1 and N5 and is a resistance of 15 ohms. When macro M1 has been fully described, the end of macro (EOM) designation is written. Description 204 is the text description for macro M2 of resistive circuit 100. It is described in the same syntax as description 200. It is seen in description 204 that macro M2 and instances of macro M1 share common nodes with different names. For instance, primary node N1 of instance @ I1 of macro M1 is designated node NN6 in macro M2 (which is one terminal of resistor R1 in macro M2). Macro M2, as shown in description 204, includes two instances of M1, labeled @ I1 M1 and @ I2 M1. The descriptions of the two instances of M1 include only the external nodes of M1, that is the nodes seen by macro M2. Description 208 describes independent voltage sources V1, V3 and V4. Voltage source V1 is described as a DC voltage source between node 1 of macro M2 and ground, with a value of one volt. Voltage sources V3 and V4 are similarly described. Finally, description 210 shows the instantiation of instance top of macro M2, designated @ top M2. This instance description includes primary terminals 1, 2, 3, 4 and 5 of instance top of macro M2. The word END designates the end of the entire description of resistive circuit 100.

Figure 3:
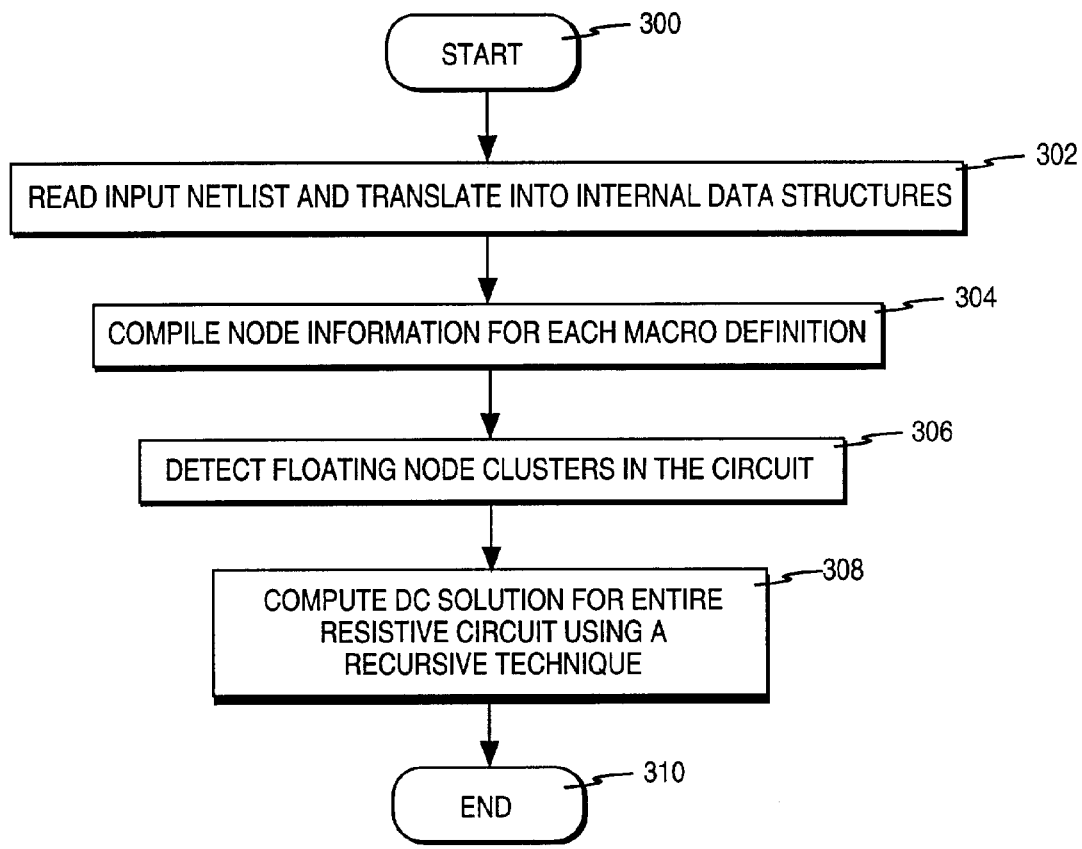
FIG. 3 is an overview flow diagram of a simulation method according to one embodiment.

FIG. 3 is an overview flow diagram of a method of simulating resistive circuit 100 according to one embodiment of the present invention. The process of simulating resistive circuit 100 begins at step 300. The input netlist of FIG. 2 is translated into internal data structures at step 302.

Next, at step 304, node information is compiled for each macro defined. Next, at step 306, floating node clusters in the circuit are detected. At step 308, a DC solution is computed for the entire resistive circuit using a DC solution technique. As will be explained more fully below, different embodiments use different DC solution techniques. The chosen DC solution technique is first used to find "local" or macro level solutions for terminal node voltages using unit voltage sources. At step 308, actual node voltages are applied to external nodes of the resistive network and the local solutions are used in a recursive traversal of the resistive circuit until all node voltages and branch currents are determined. When all node voltages and branch currents are determined, the process goes to end 310.

Figure 4:
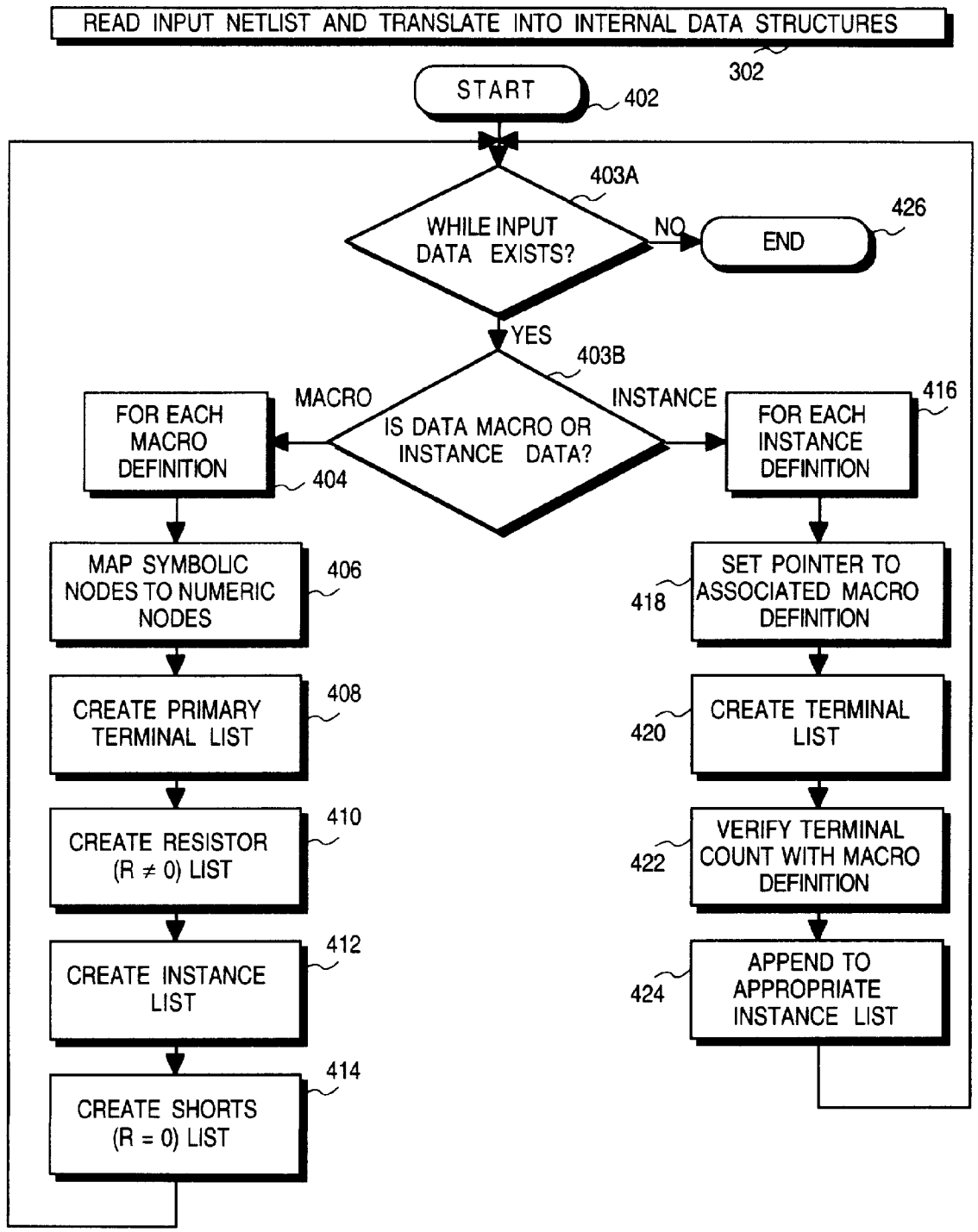
FIG. 4 is a flow diagram of reading an input netlist and translating the input netlist according to one embodiment.

FIG. 4 is a flow diagram showing in more detail the steps included in step 302 of FIG. 3, reading and translating the input netlist. The start of step 302 is shown as block 402. At block 404 it is stated that the subordinate steps, steps 406, 408, 410, 412 and 414 are executed for each macro definition. For each macro definition, at step 406, symbolic nodes are mapped to numeric nodes.

Referring now to FIG. 5, an example of a node map for resistive circuit 100 is shown. Symbolic node names are mapped into consecutive numeric indices for easy manipulation and analysis. Each macro description, as well as the top level circuit, has a separate node map. As shown in FIG. 5, node map 502 is the node map for macro M1, and includes the symbolic node names of macro M1 on the right and the consecutive numeric indices corresponding thereto on the left. Similar node maps 504 and 506 are included for macros M2 and for the top level circuit, respectively.

Referring again to FIG. 4, after symbolic nodes are mapped to numeric nodes at step 406, a primary terminal list is created at step 408. The primary terminal list includes only primary terminals for each macro of resistive circuit 100 and for the top level circuit 100 itself. Next, at step 410, a list of resistors that do not have a zero resistance value is created. At step 412 a list of instances is created. For example this would include instances @ I1 and @ I2 of M1 and instant @ top of macro M2. At step 414 a list of shorts is created. This list includes all resistances that have a value of zero. After the creation of the short list, the translation that occurs for each macro definition is at end 426.

Following start 402, block 416 designates that following steps 418, 420, 422 and 424, occur for each instance definition. At step 418 a pointer is set to an associated macro definition. Next, a terminal list for each instance is created at step 420. For example, instances @ I1 and @ I2 of macro M1 would have their own terminal lists. Next, at step 422, the terminal count is verified with macro definitions. Next at step 424, the terminal count is appended to the appropriate instance list, and the processing of each instance definition for step 302 is at end 426.

Figure 6:
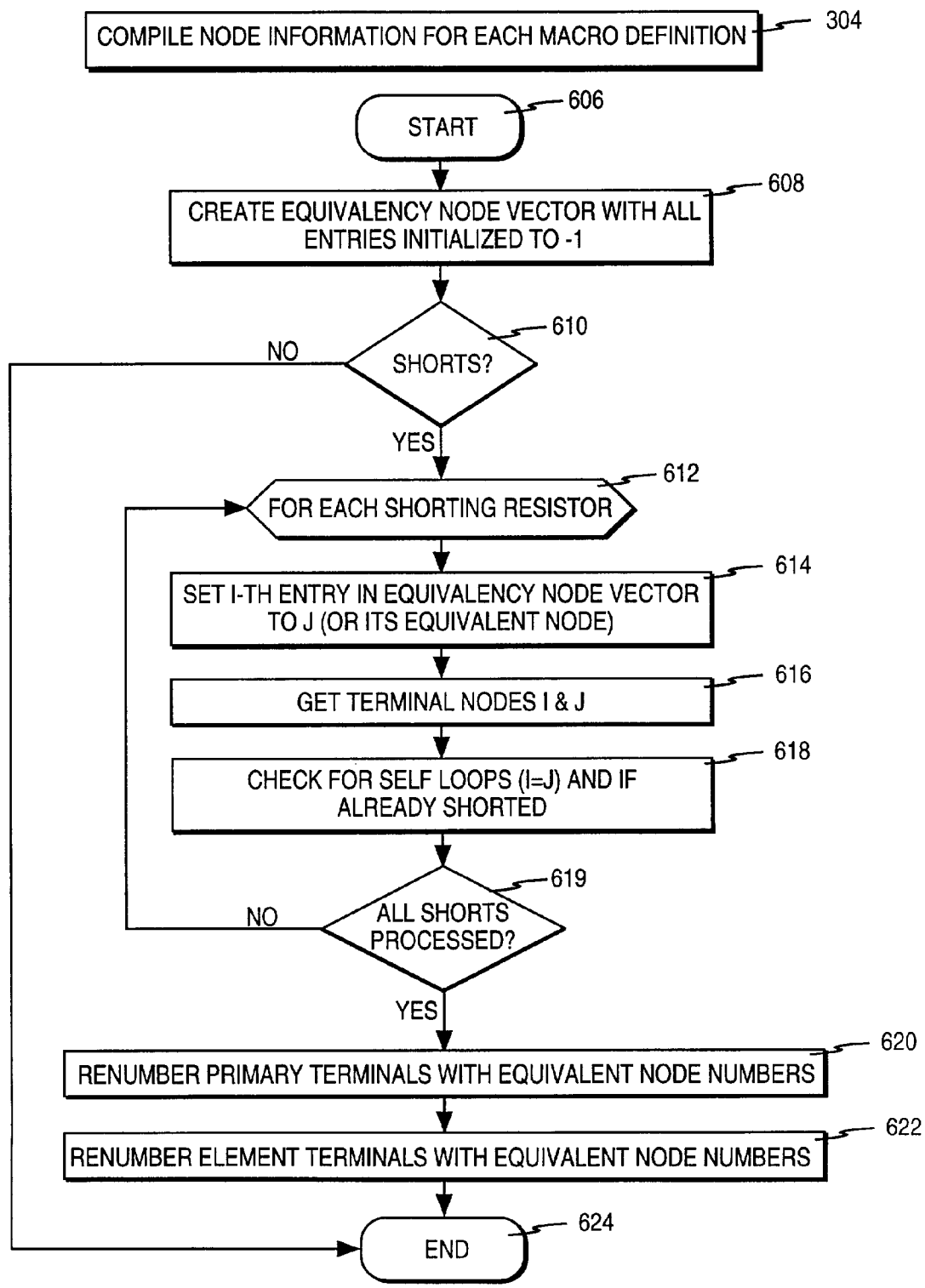
FIG. 6 is a flow chart of compiling node information for each macro according to one embodiment.

FIG. 6 is a flow diagram showing detail of step 304 from FIG. 2, compiling node information for each macro definition. Block 606 is the start of compiling node information for each macro definition. First, at step 608, an equivalency node vector is created with all entries initialized to −1. −1 is an arbitrary choice and could be any other designation. −1 is chosen in this case because it is not easily confused with other designators used in data structures of the present invention because other designators are typically nonnegative. Next, at step 610, it is determined whether there are any shorts in resistive circuit 100. If resistive circuit 100 contains no shorts, the process goes to end 624. If resistive circuit 100 does contain shorts, the process moves to block 612 where procedures are followed for each shorting resistance. Steps 612, 614, 616 and 618 constitute a loop that is repeated for each shorting resistance. At step 614 the i-th entry in the equivalency node vector is set to j (or its equivalent node if is part of a short circuit). At step 616 terminal nodes i and j are fetched and at step 618 there is a check for a self loop, and a check for whether nodes i and j are already shorted. At step 619 it is determined whether all shorts have been processed. If all shorts have not been processed, then the loop of steps 612, 614, 616 and 618 is repeated for another set of nodes. If all shorts have been processed, the process moves to step 620 where primary terminals are renumbered with equivalent node numbers. At step 622 element terminals with equivalent node numbers are renumbered. In this embodiment, elements are resistors. After renumbering, the process is at end 624.

FIG. 7 is an example of a shorted node map produced by the process described in FIG. 6. Shorted node map 700 is a shorted node map for macro M2. As shown, all nodes are labeled on the left with their sequential numbers. These are the sequential numbers that replace the symbolic numbers used earlier in the process. On the right hand side, a −1 corresponds to each node that is not equivalent to another node. As shown in resistive circuit 100, there is a short circuit between nodes NN9 and NN4 of macro M2, which have been renumbered 9 and 4. Therefore, node 9 is listed in the shorted node map as being equivalent to node 4.

Figure 8:
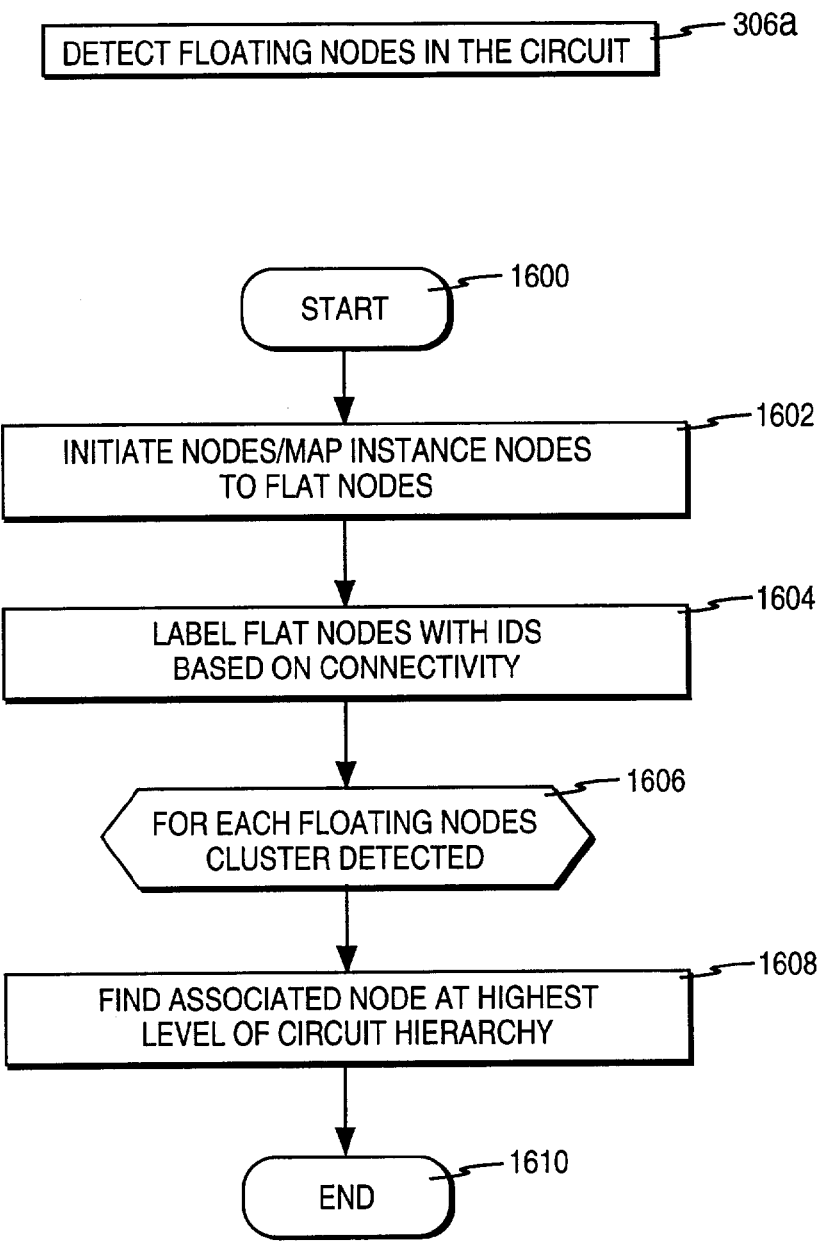
FIG. 8 is a flow diagram of detecting floating node clusters according to one embodiment.

Two methods of performing step 306 of FIG. 3 according to two embodiments will be described. FIG. 8 is a flow diagram showing detail of method 306a of performing step 306 of FIG. 3 according to one embodiment. Method 306a detects floating nodes by performing a efficient recursive traversals of the circuit hierarchy. Node maps are created, and all nodes are mapped to flat nodes. It is then possible to label nodes with IDs based on their connectivity. Then a traversal of the circuit is started from a ground node. In a fully connected circuit, all nodes will have a same ID as the ground node after a complete traversal. If there are floating nodes, however, the floating nodes will have different IDs from the ground node, and clusters of floating nodes will share a same ID. According to this embodiment, only a single vector of length equal to the total number of flat nodes is sufficient to store the IDs of the flat nodes, making this embodiment very storage efficient. The method of FIG. 8 can be viewed as "virtual" flattening of the circuit because no resources are used to store a flattened circuit.

From start 1600, nodes are instantiated and instance nodes are mapped to flat nodes at step 1602. Next, flat nodes are labeled with IDs based on connectivity at step 1604. For each floating node cluster detected, as shown in step 1606, the node at the highest level of circuit hierarchy is found at step 1608, and the process comes to end 1610.

Figure 9:
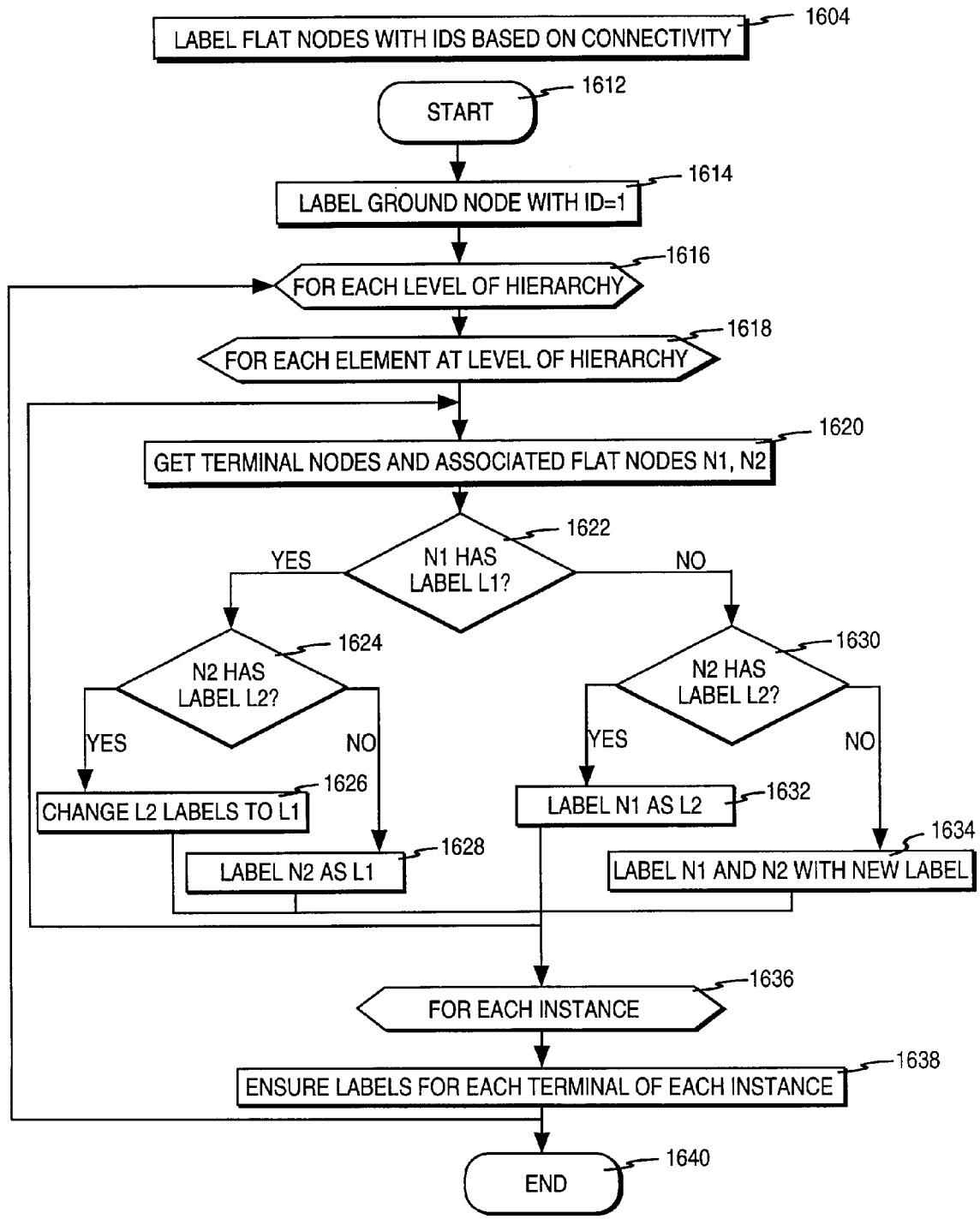
FIG. 9 is a flow diagram of labeling flat nodes with IDs based on connectivity according to the embodiment of FIG. 8.

FIG. 9 is a flow diagram showing detailed steps included in step 1604 of FIG. 8 (labeling flat nodes with IDs based on connectivity). From start 1612, a ground node is labeled with an ID of "1". The actual ID is arbitrarily chosen and could be any other ID. For each level of hierarchy, as indicated by step 1616, steps are performed for each element at the level of hierarchy as indicated by step 1618. An element herein is a resistive element. At step 1620, terminal nodes and associated flat nodes are determined, where flat nodes are denoted n1, n2, and so on. At decision block 1622, it is determined whether node n1 has a label L1. The label L1 is arbitrarily chosen and could be any label previously given to node n1. If node n1 has label L1, then, at step 1624, occurrences of label L2 are changed to label L1. If n2 does not have label L2, then, at step 1628, node n2 is labeled as L1. Referring again to decision block 1622, if node n1 does not have label L1, then it is determined at step 1630 whether node n2 has label L2. If node n2 has label L2, then at step 1632, node n2 is labeled as L2. If node n2 does not have label L2, then at step 1634, nodes n1 and n2 are labeled with a new label. Step 1622 and the steps performed after the decision of step 1622 assure that connected nodes that are encountered during a walkthrough of the circuit from a ground node have the same labels. For example, in the case of step 1626, the labels are found to be different and so they are merged. In the case of step 1634, a label could not be determined for either node, so the nodes are given a same new label.

For each instance as shown starting with step 1636, it is next ensured that each terminal of each instance has a label. Each terminal must have a label or the labels cannot be propagated internally as required, for instance, in order to determine which nodes are connected to ground at higher levels of hierarchy. Unlabeled nodes are identified by another arbitrary ID, for example "0". When such a node is encountered, it is given a new, previously unused label.

Figure 10:
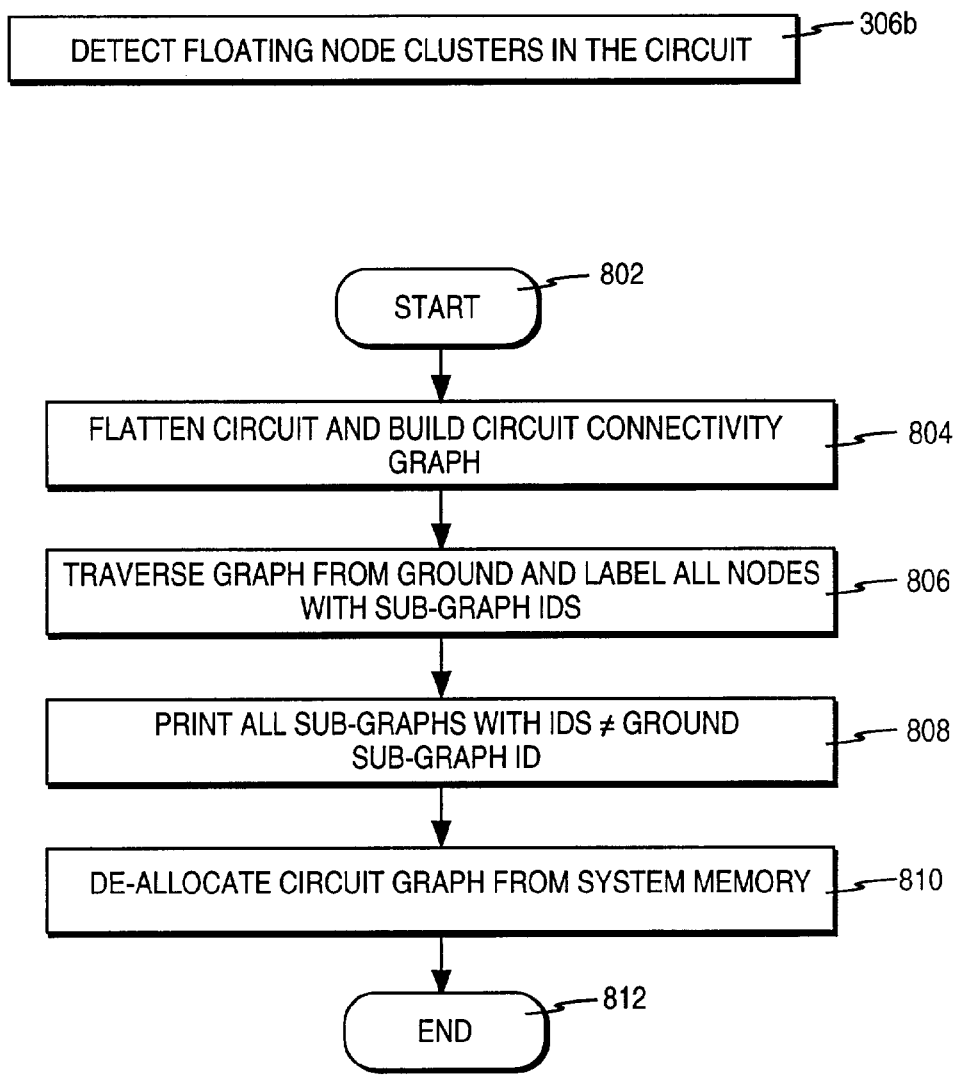
FIG. 10 is a flow diagram of detecting floating node clusters according to one embodiment.

FIG. 10 is a flow diagram showing detail of method 306b of performing step 306 of FIG. 3 according to a different embodiment from the embodiment of FIGS. 8 and 9. Method 306b includes flattening the entire circuit and temporarily storing a connectivity graph. This method therefore requires more storage than method 306a and also incurs the performance penalty of allocating and deallocating memory for storage of the connectivity graph.

From start 802, the circuit is flattened and a connectivity graph of the circuit is built at step 804. As is known, a connectivity graph merely shows what each node in the circuit is connected to. Next, at step 806, the connectivity graph is traversed from ground and all nodes encountered are labeled with subgraph identifiers (ids). Then, at step 808, all subgraphs with ids that are not equal to the ground subgraph id are printed for later reference. At step 810, the circuit graph is deallocated from system memory before end 812. This frees memory for other purposes.

According to this embodiment, a connectivity graph is used rather than a walkthrough of nodes labeled according to connectivity, as in the previously described embodiment. Therefore, in this embodiment, is necessary to flatten the circuit in order to detect floating nodes because floating nodes cannot be detected by examination of a macro circuit alone. This is because, based on the connection of the macro and its containing macro and so on, a node cluster that is not floating at one level of hierarchy may, in fact, be floating at another level of hierarchy. In the example of resistive circuit 100, nodes NN2, NN7 and NN13 of instance top of macro M2 and nodes N3, N6 and N4 of instance I1 of macro M1 are not connected to the ground or to any input voltage source, and are hence floating. During traversal of the graph as in step 806, all of the nodes in the floating node cluster will receive the same label, or subgraph id. Therefore, each floating node cluster will have its own subgraph id which is not the same as the ground subgraph id. These floating node clusters are handled by grounding the node at the topmost level. It is not necessary to ground every node. In this way, numerical singularities in the circuit matrix to be developed later are prevented. For the particular node cluster of resistive circuit 100 it is only necessary to store node 2 at the topmost level.

Figure 11:
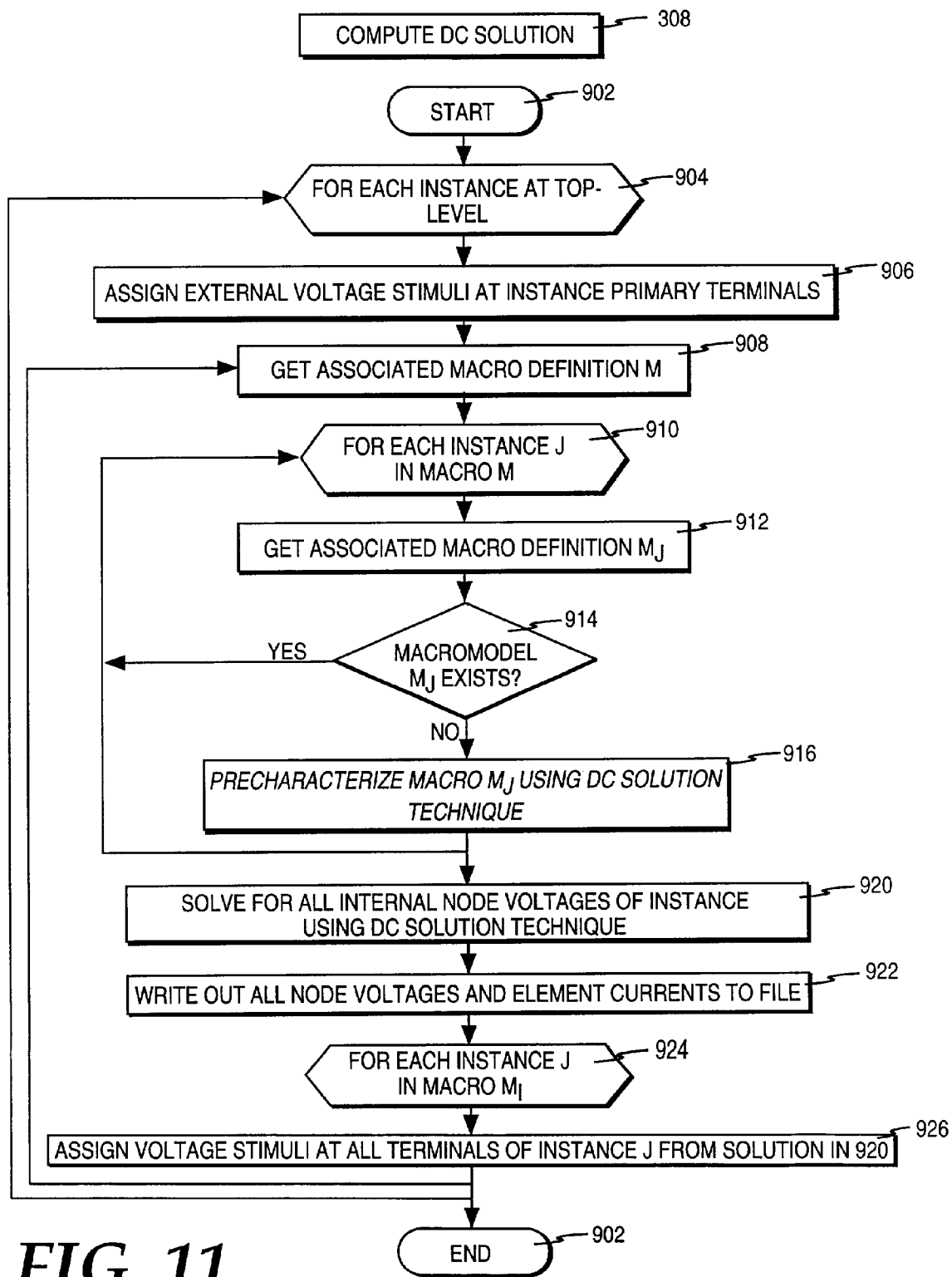
FIG. 11 is a flow diagram of computing a direct current ("DC") solution for the entire resistive circuit according to one embodiment.
Figure 15:
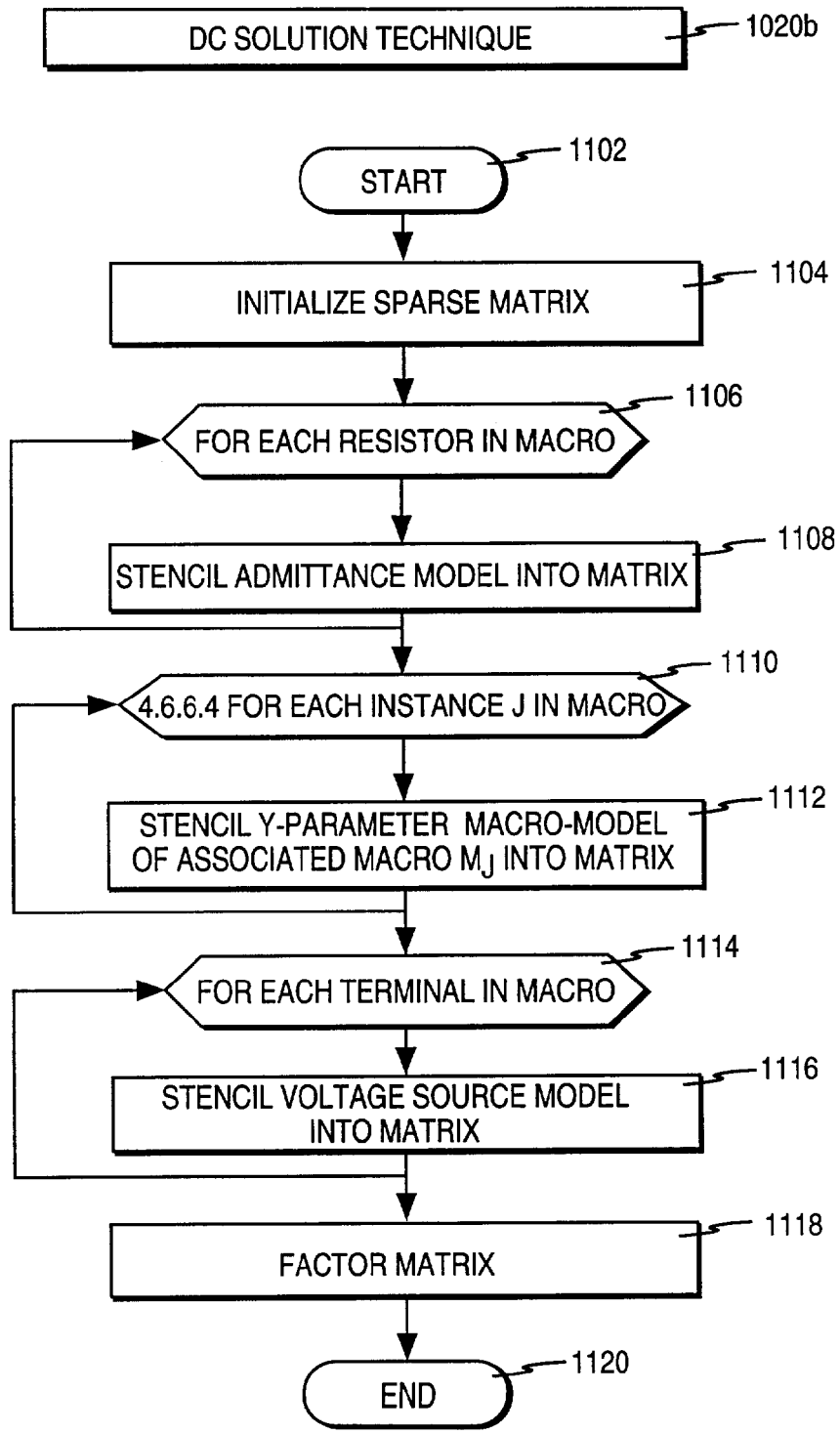
FIG. 15 is a flow diagram of a DC solution technique of another embodiment.

FIG. 15 is a flow diagram showing detailed step of step 308 of FIG. 3, computing a DC solution for the entire resistive circuit using a DC solution technique. The process begins at block 902. For each instance of a macro at the top level of hierarchy, as indicated by block 904, multiple steps are followed. For each instance at the top level, external voltage stimuli are applied at the primary terminals of the instance at step 906. The voltage stimuli are actual operating voltage known to be applied at the terminals of the top level instances when the circuit is operational. At step 908, a macro definition for the instance is acquired from a storage device. For each instance J in the macro M, as indicated in step 910, several subordinate steps are taken. "J" and "M" denote variables that take on progressively greater values in the recursive procedure of FIG. 11. For each instance J in macro M, an associated macro definition is acquired at step 912. Then, at step 914, it is determined whether a macro-model $M_J$ exists. If the macromodel does exist, the process returns to step 910 to get a next macro definition M. If the macromodel does not exist. The macromodel $M_J$ is precharacterized using a DC solution technique at step 916. Steps 910, 912, 914, and 916 are repeated for all macro definitions M.

After all macromodels are acquired and all macros not having macromodels are precharacterized, for each top level macro a solution is found giving all internal node voltages of the instance using the DC solution technique at step 920. All node voltages and element currents are then written to a file. For each instance J in macro $M_J$, as indicated at step 924, voltage stimuli are applied at all terminals of instance J from the solution found in step 920. As indicated by arrows from step 920, appropriate steps are repeated for each top level instance and for each macro definition. The process is then at end 902.

Figure 12:
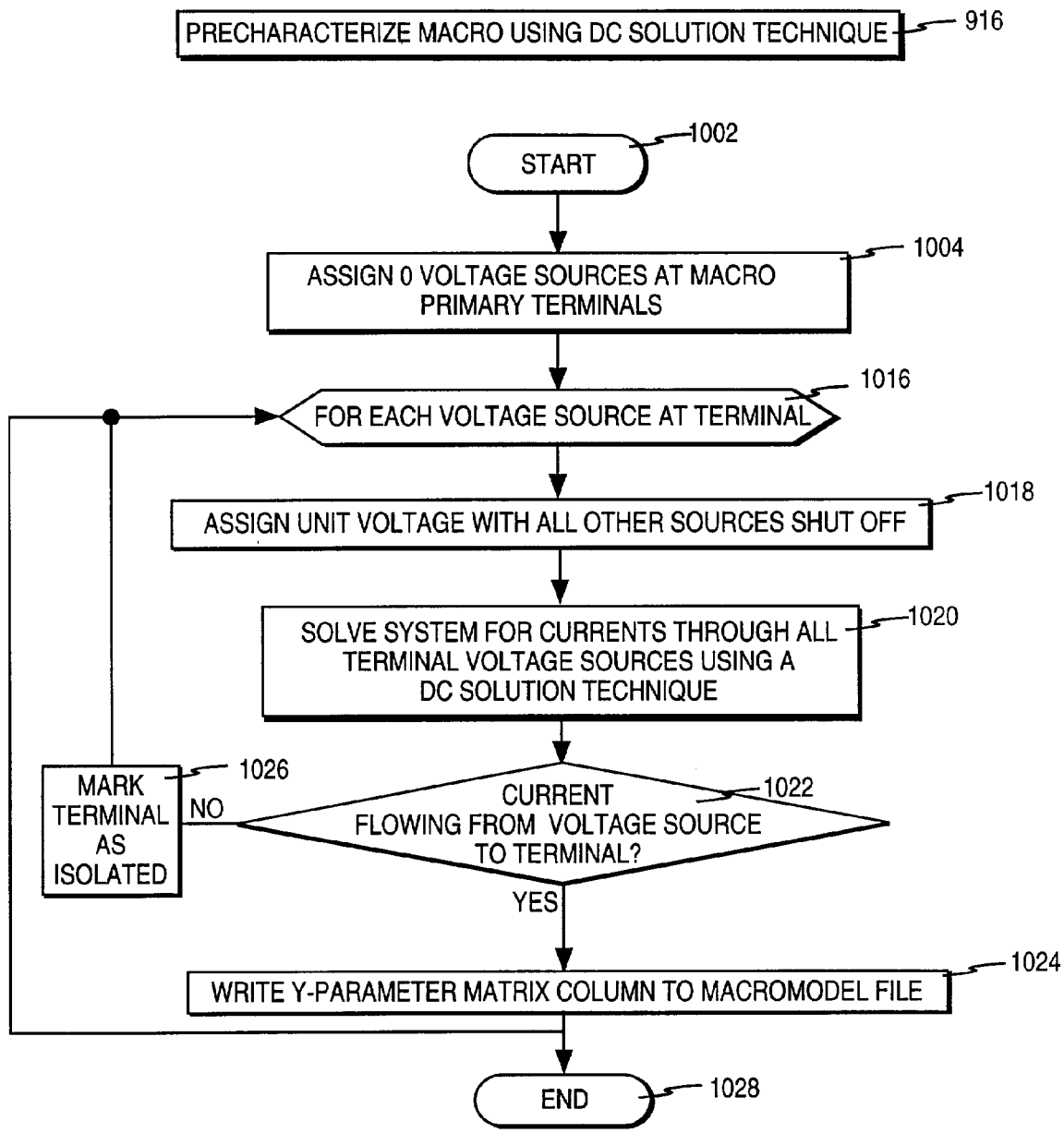
FIG. 12 is a flow diagram of precharacterizing a macro using a DC solution technique.

FIG. 12 shows detailed steps of step 916 of precharacterizing a macro using a DC solution technique. From start 1002 of FIG. 12, zero voltage sources are assigned to primary terminals of the macro. Next, for each voltage source at a terminal, as indicated at step 1016, several subordinate steps are taken. At step 1018, a unit voltage source is assigned with all other sources shut off. The system is then solved for currents through all terminal voltage sources at step 1020. It is determined at step 1022 whether there is current flowing from the voltage source to the terminal. If there is voltage lowing, then at step 1024 the y-parameter matrix for the macro is written to a macromodel file and another voltage source is acquired at step 1016. If there is no current flowing, then the terminal is marked as isolated at step 1026 and another voltage source is acquired at step 1016. When all voltage sources have been handled, the process is at end 1028.

Figure 13:
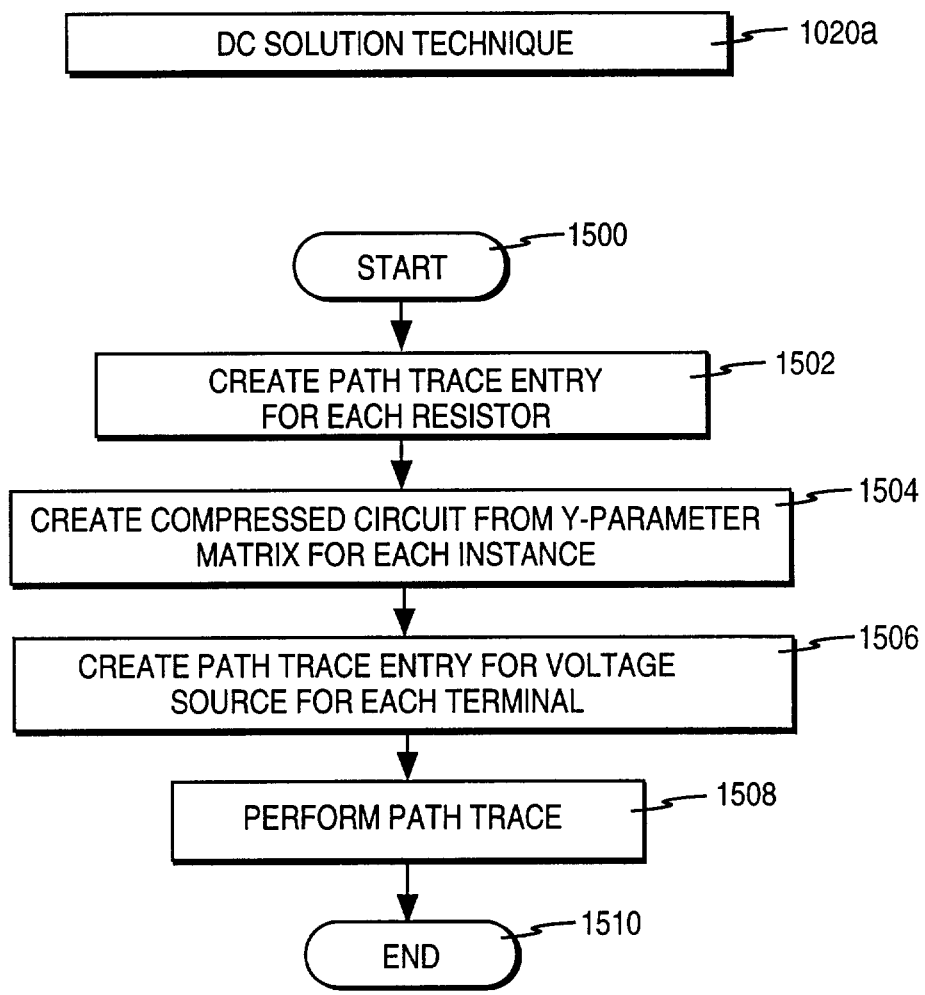
FIG. 13 is a flow diagram of a DC solution technique of one embodiment.

FIG. 13 is a flow diagram showing the steps of DC solution technique 1020a of one embodiment. From start 1500, a path trace entry is created for each resistance at step 1502. A path trace entry is an internal data structure, typically a vector, that represents the resistance. Next, at step 1504, a compressed circuit is created from a y-parameter from the macromodel file for each instance. At step 1506, a path trace entry is created for the voltage source for each terminal. A path trace is then performed according to known methods at step 1508, and the process goes to end 1510.

Figure 14:
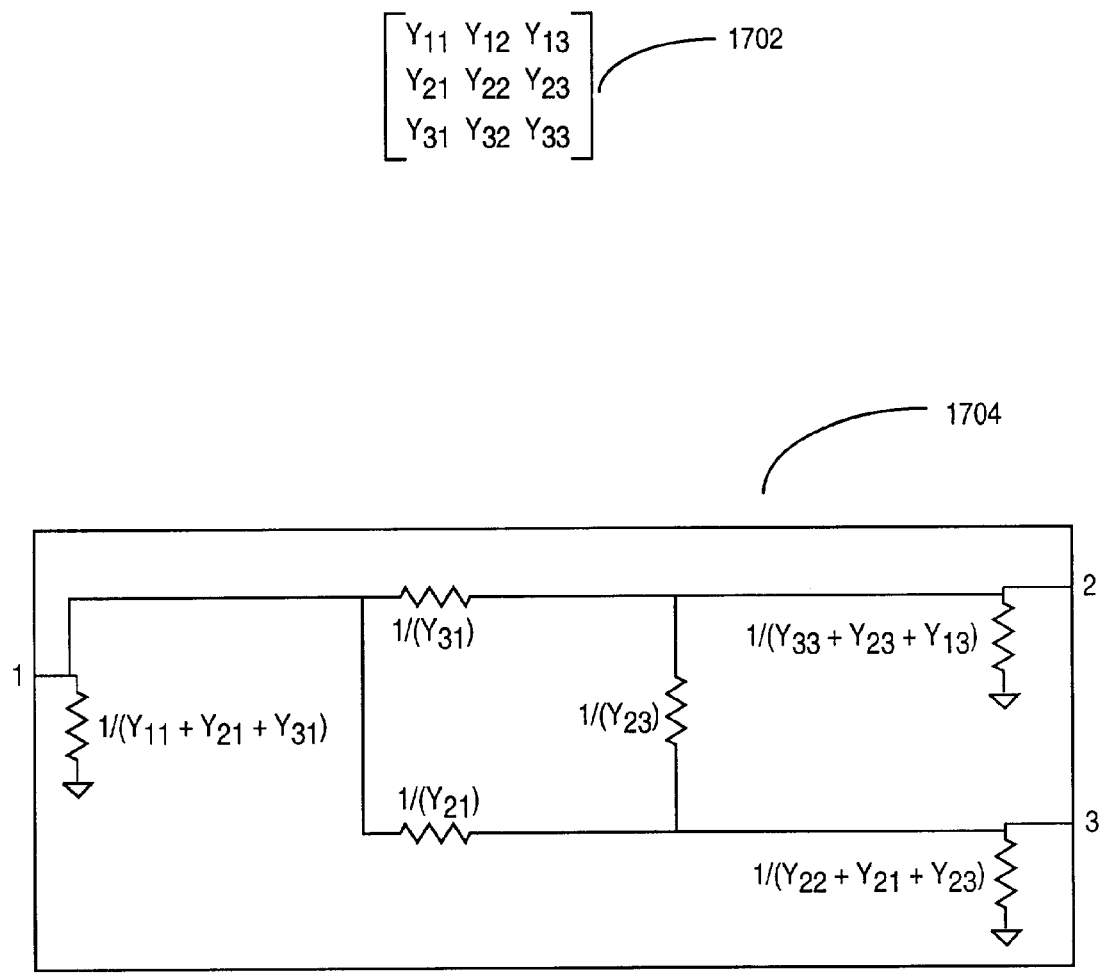
FIG. 14 is a diagram of compressed circuit generated from a y-parameter matrix.

FIG. 14 is a diagram of a compressed circuit generated from a y-parameter matrix. Y-parameter matrix 1702 is an example of an y-parameter matrix created for a macromodel. Circuit diagram 1704 is an equivalent, compressed circuit created using y-parameter matrix 1702. The resistance values are shown as equations derived from y-parameter matrix 1702. Compressed circuit 1704 represents one of many small compressed circuits that make up a typical resistive circuit. According to the path tracing technique of the presently described embodiment, the nodes of compressed circuit 1704 are stepped through for the purpose of determining node voltages and branch currents. According to this method of generating a compressed circuit, the resistive circuit has no more nodes than the number of terminal nodes of the macro, which makes the analysis process faster and simpler than alternate methods that include nodes internal to a macro.

FIG. 15 is a flow diagram showing the steps of DC solution technique 1020b of another embodiment. DC solution technique 1020b, in general, uses a matrix solution technique. The decision whether to use a path tracing technique or a matrix solution is dependent on several factor, including circuit size and topology. System limitations may also be a factor. For example, matrix solutions employ sparse matrices that are not very efficient in terms of speed, but consume slightly less storage.

The process of DC solution technique 1020b begins at block 1102. Note that 4 parameters refers to "admittance of a circuit such as current/voltage including phase therebetween." First, at step 1104 a sparse matrix is initialized. Next at loop 1106, for each resistor in the macro, step 1108 of stenciling an admittance model into the matrix is performed. The admittance model is arrived at by using the resistances, which are known, and the well known equation for admittance, and constructing a matrix according to well known techniques. The next loop in the process is loop 1110, in which step 112 of stenciling a y-parameter macromodel of an associated macro $M_J$ into the matrix is performed for each instance J in the macro. Next, loop 1114 is performed, wherein step 1116, stenciling a voltage source model into the matrix, is performed for each terminal in the macro. Finally, the matrix is factored at step 1118 and the process is at end 1120.

The present invention has been described with respect to a particular embodiments demonstrating that a very large hierarchical resistive circuit is analyzed and simulated much more quickly and with much less memory usage than is possible with conventional simulation tools. As has been shown, the present invention exploits the hierarchical nature of the resistive circuit by characterizing each macro in terms of behavior at its primary terminals. In this way, it is not necessary to flatten the entire circuit or create huge, unmanageable matrices with impossibly large numbers of nodes.

An advantage of the present invention is the way in which memory usage is reduced. One way in which memory usage is minimized is that data structures which are not required throughout the entire process are not stored. For instance, when the circuit is flattened during handling of floating nodes according to the embodiment of FIG. 10, the flattened circuit characterization is not stored after the floating nodes have been detected. In addition, when y-parameter macromodels have been created, they can be written to disk and later referenced rather than using local memory. Further, macromodel storage is made as economical as possible by storing only nonzero, nonredundant elements of the matrix. This is illustrated by FIG. 16.

Figure 16:
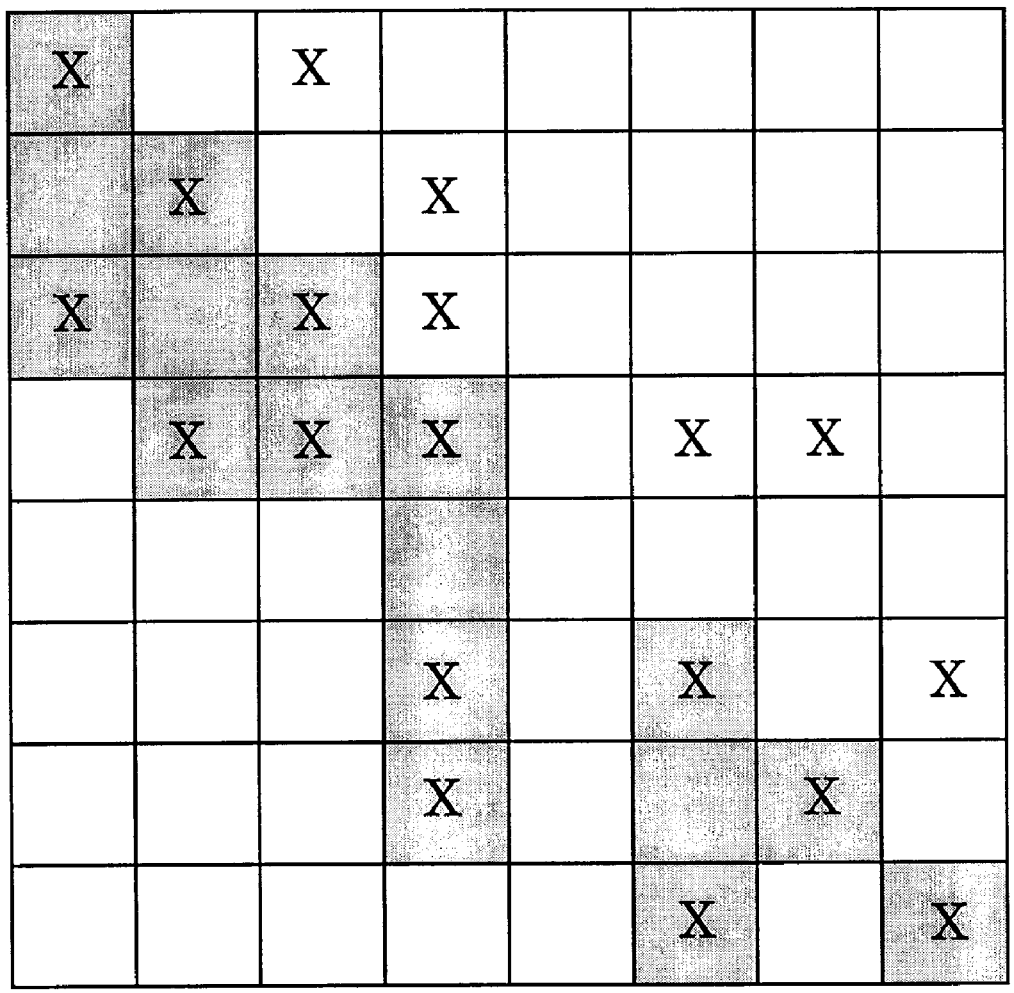
FIG. 16 is an example of matrix elements selected for storage according to one embodiment.

FIG. 16 shows an exemplary 8×8 y-parameter matrix. It is not necessary for the cases encountered in analysis of resistive circuits to store all the entries of the y-parameter matrix. For the cases considered herein, the y-parameter matrix is symmetric about the diagonal. As such, this reduces the size of the matrix almost by half because it is only necessary to store the diagonal and the lower triangle of the matrix. In addition, due to the nature of connections typically encountered in the circuits considered, the y-parameter matrix has entries clustered mostly about the diagonal. Therefore, when each column of the y-parameter matrix, rather than the entire column below the diagonal is stored, the highest row in the column that has a nonzero entry is located. Only entries up to that point are stored. This method has been extremely effective as a data reduction heuristic, yielding reductions in data size of up to ninety (90) percent.

In FIG. 16, Xs in the matrix denote the presence of nonzero entries. To store the matrix in its entirety would require storage for sixty-four (64) numbers. Since the matrix is symmetric, storing only the diagonal and the lower triangle would require storage for only eight (8) plus twenty-eight (28), or thirty-six (36) numbers. This represents a reduction of storage space required of 43.75%. Further, recognizing that in each column it is unnecessary to store zero values, only the shaded subcolumns need to be stored, as explained previously. In this case, the total number of entries would be seventeen (17), representing a reduction of over 73% in storage space required. Each column also requires an additional integer to be stored specifying the number of entries below the diagonal that are stored. In one embodiment, y-parameters are written out to disk rather than stored in memory, and are reused as needed. This allows for fast reads and writes and further reduces demands on computation resources.

Figure 17:
FIG. 17 is an example of an output file according to one embodiment.

As previously mentioned, the present invention as described yields node voltages and branch currents for resistive circuit 100 or any resistive circuit that is simulated. The present invention provides distinct advantages over conventional methods because the output information retains hierarchical information as it appears in the input text description, or netlist. FIG. 17 shows output file 1300. Output file 1300 reflects the results of performing the steps of FIG. 3 on resistive circuit 100. As shown, output file 1300 displays instance name, macro name, original resistance number, original voltage source number, and corresponding current and resistance information. For example, instance top of macro M2 shows a current of 1.2346 e-02 amperes through resistor R1. Upon examining output file 1300, a designer can observe unacceptable results, for example an excess of current through a particular resistor, and re-design accordingly. The location of the particular anomaly is easily identified because the original hierarchical information is intact.

FIG. 18 shows output file 1400, which is another example of output resulting from execution of the steps of FIG. 3. Output file 1400 lists DC voltages in association with hierarchical information, including a particular instance, index, and node name for each DC node voltage.

Although the present invention has been described in terms of specific embodiments. For example, the embodiment described produces branch current and node voltages for a resistive circuit. Various modification and alterations might be made by those skilled in the art, however, without departing from the spirit and scope of the invention as set forth in the following claims.

What is claimed is:

1. A computer implemented method for simulating a resistive circuit including a plurality of macro circuits that are arranged hierarchically, comprising:

reading a netlist description of the resistive circuit; and recursively traversing the resistive circuit starting from terminal nodes of a macro circuit at a highest level of hierarchy and ending at a lowest level of hierarchy using precharacterizations of each of the plurality of macro circuits to determine node voltages and branch currents of the resistive circuit, said precharacterizations obtained by constructing y-parameter models for each of the plurality of macro circuits.

2. The method of claim 1, wherein precharacterizing further comprises:

generating a compressed circuit from each of the y-parameter models;

assigning a unit voltage to a voltage source of each compressed circuit; and traversing each compressed circuit using a path tracing technique to determine terminal voltages of each macro.

3. The method of claim 1, further comprising detecting floating nodes, including:

mapping nodes of the resistive circuit to flat nodes, wherein flat nodes are all at a same level of circuit hierarchy;

labeling the flat nodes based upon connectivity of the flat nodes;

determining a floating node based on a label of the floating node being unlike labels of nodes that are connected to voltage sources; and connecting the floating nodes to ground.

4. The method of claim 3 further comprising:

verifying that each terminal node of each of the plurality of macro circuits has a label; and assigning a previously unused label to each terminal node that does not have a label.

5. A computer implemented method for simulating a resistive circuit including a plurality of macro circuits that are arranged hierarchically, comprising:

reading a netlist description of the resistive circuit by using a computer;

translating the netlist description into a set of data structures, including detecting floating nodes; and precharacterizing the plurality of macro circuits as macro models, by computing currents at each primary terminal of a first macro circuit at a first level of hierarchy, and computing currents at each primary terminal of a second macro circuit at a second level of hierarchy, wherein the first macro circuit is contained in the second macro circuit, and wherein only the primary terminals of the first circuit are used in computing the currents at each primary terminal of the second macro circuit.

6. The computer implemented method of claim 5, wherein said translating comprises:

creating a node map for each macro circuit such that each node is given a label; and detecting a short circuit, and in response, assigning two nodes joined by the short circuit a same label.

7. The computer implemented method of claim 5, wherein said precharacterizing comprises:

computing a set of y-parameters for each macro circuit;

generating equations for branch currents of each macro circuit using the y-parameters; and solving for currents at primary terminals of each macro circuit.

8. The computer implemented method of claim 7, further comprising storing the macro models.

9. The computer implemented method of claim 8, further comprising analyzing the resistive circuit to obtain actual node voltages and actual branch currents of the resistive circuit, wherein actual node voltages and actual branch currents correspond to at least one operating source voltage of the resistive circuit.

10. The computer implemented method of claim 9, wherein analyzing comprises:

computing actual node voltages and actual branch currents of the resistive circuit at a topmost level of the hierarchy; and recursively computing actual node voltages and actual branch currents of macro circuits at levels of the hierarchy lower than the topmost level using the macro models.

11. The computer implemented method of claim 10, further comprising storing the actual node voltages and actual branch currents of the resistive circuit.

12. The computer implemented method of claim, 7, wherein generating equations includes generating a modified nodal admittance (MAN) matrix for each macro circuit.

13. The computer implemented method of claim 12, wherein solving for currents includes solving the MAN matrices.

14. The computer implemented method of claim 7, wherein detecting floating nodes comprises:

flattening the resistive circuit to one level of hierarchy;

assigning identifiers to nodes of the flattened resistive circuit such that each node connected to ground has a same identifier and each node not connected to ground has a different identifier; and storing a list of the nodes and identifiers.

15. The computer implemented method of claim 14, wherein computing y-parameters includes:

reading the list of nodes and identifiers; and when a node with the different identifier is encountered, assigning the node a zero voltage.

16. The computer implemented method of claim 8, wherein storing includes storing only elements of the MAN matrix that are non-zero and not redundant.

17. A machine readable medium, having stored thereon executable instructions which when executed by a computer comprising:

reading a computer readable description of a circuit that includes a plurality of subcircuits at different levels of hierarchy;

translating the computer readable description into a plurality of data structures, including characterizing a behavior of a subcircuit at primary terminals of the subcircuit;

using the characterization of the behavior of a subcircuit at a lower level of hierarchy to characterize the behavior of a subcircuit at a higher level of hierarchy, said characterization further comprising:

constructing y-parameter models for each of the macro circuits;

determining node voltages and branch currents of the circuit using characterizations of subcircuits of the circuit and source voltage values of the circuit; and labeling the node voltages and the branch currents with hierarchical information.

18. The machine readable medium of claim 17, wherein the executable instructions, when executed, further cause the following to be performed:

detecting a floating node cluster of the circuit comprising at least one node that is not connected to a voltage source;

storing a record of the floating node including hierarchical information; and connecting a node of the floating node cluster at a highest level of hierarchy to a voltage source.

19. The machine readable medium of claim 17, wherein the executable instructions, when executed, further cause the following to be performed:

detecting a short circuit comprising at least two nodes that are electrically equivalent; and labeling the nodes that are electrically equivalent with a same identifier.

20. The machine readable medium of claim 17, wherein determining node voltages and branch currents of the circuit comprises:

generating a set of y-parameters for each subcircuit; and generating equations for branch currents and node voltages for each subcircuit.

21. The machine readable medium of claim 20, wherein determining node voltages and branch currents of the circuit further comprises generating a modified nodal admittance (MAN) matrix for each subcircuit.

22. The machine readable medium of claim 21, wherein determining node voltages and branch currents of the circuit further comprises storing non-zero elements of the MAN matrix.

* * * * *